United States Patent
Ichihara

(10) Patent No.: US 11,442,092 B2
(45) Date of Patent: Sep. 13, 2022

(54) POWER CONVERSION DEVICE AND METHOD FOR DETECTING MAGNETIC SATURATION OF COMMON-MODE REACTOR

(71) Applicant: Mitsubishi Electric Corporation, Tokyo (JP)

(72) Inventor: Masafumi Ichihara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/623,251

(22) PCT Filed: Sep. 2, 2019

(86) PCT No.: PCT/JP2019/034465
§ 371 (c)(1),
(2) Date: Dec. 28, 2021

(87) PCT Pub. No.: WO2021/044496
PCT Pub. Date: Mar. 11, 2021

(65) Prior Publication Data
US 2022/0206050 A1 Jun. 30, 2022

(51) Int. Cl.
*G01R 27/26* (2006.01)
*H02P 27/06* (2006.01)

(52) U.S. Cl.
CPC .......... *G01R 27/2611* (2013.01); *H02P 27/06* (2013.01)

(58) Field of Classification Search
CPC ............................ G01R 27/2611; H02P 27/06
See application file for complete search history.

(56) References Cited

U.S. PATENT DOCUMENTS

| | | | |
|---|---|---|---|
| 2007/0087722 A1* | 4/2007 | Ichihara | H04B 3/54 455/343.1 |
| 2012/0187894 A1 | 7/2012 | Higuchi et al. | |

(Continued)

FOREIGN PATENT DOCUMENTS

| JP | 2004-260963 A | 9/2004 |
|---|---|---|
| JP | 2006-352949 A | 12/2006 |

(Continued)

OTHER PUBLICATIONS

International Search Report and Written Opinion dated Nov. 5, 2019, received for PCT Application PCT/JP2019/034465, Filed on Sep. 2, 2019, 7 pages including English Translation.

(Continued)

*Primary Examiner* — Rafael O De Leon Domenech
(74) *Attorney, Agent, or Firm* — Xsensus LLP

(57) ABSTRACT

A power conversion device includes a semiconductor power converter that converts direct current power into alternating current power for a motor, a common-mode reactor having first and second auxiliary windings added thereto, the common-mode reactor reducing common-mode current that may flow between the semiconductor power converter and the motor, a signal generator that superimposes an alternating current on the first auxiliary winding, and a detection circuit that detects a saturation state of the common-mode reactor on the basis of the superimposed current superimposed on the first auxiliary winding and a winding voltage generated in the second auxiliary winding by the superimposed current.

11 Claims, 6 Drawing Sheets

(56) References Cited

U.S. PATENT DOCUMENTS

| | | | | |
|---|---|---|---|---|
| 2014/0306640 A1* | 10/2014 | Yamamoto | .............. | H02P 27/08 |
| | | | | 318/504 |
| 2014/0312966 A1* | 10/2014 | Hoene | .................... | H02M 1/12 |
| | | | | 327/558 |
| 2015/0293153 A1* | 10/2015 | Boettcher | ............ | H02H 1/0007 |
| | | | | 324/117 R |
| 2018/0108472 A1* | 4/2018 | Pagenkopf | .............. | H01F 27/28 |
| 2020/0382032 A1* | 12/2020 | Takase | .................... | H02P 27/08 |

FOREIGN PATENT DOCUMENTS

| | | |
|---|---|---|
| JP | 2010-104200 A | 5/2010 |
| WO | 2011/002015 A1 | 1/2011 |

OTHER PUBLICATIONS

Decision to Grant dated Jan. 14, 2020, received for Japanese Application 2019-571085, 5 pages.

* cited by examiner

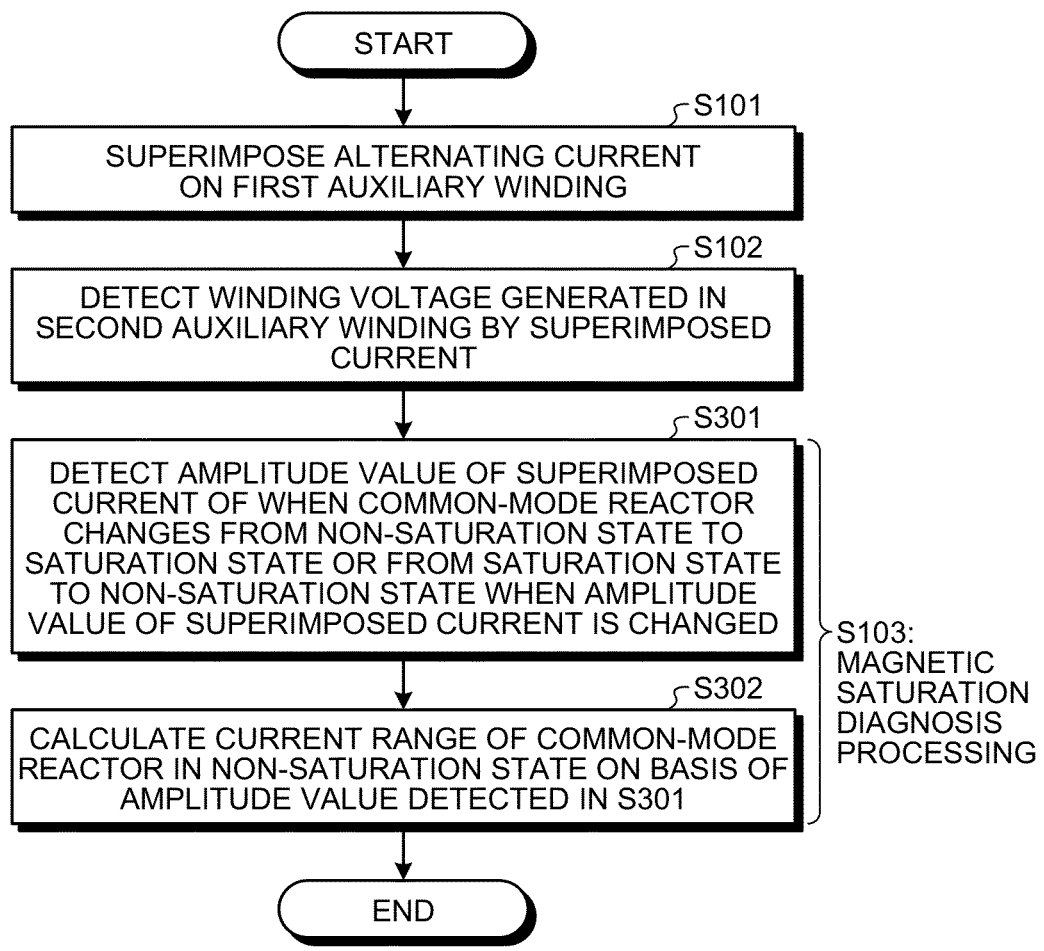

POWER CONVERSION DEVICE AND METHOD FOR DETECTING MAGNETIC SATURATION OF COMMON-MODE REACTOR

CROSS-REFERENCE TO RELATED APPLICATION

The present application is based on PCT filing PCT/JP2019/034465, filed Sep. 2, 2019, the entire contents of which are incorporated herein by reference.

FIELD

The present invention relates to a power conversion device including a common-mode reactor and a method for detecting magnetic saturation of the common-mode reactor.

BACKGROUND

A power conversion device is provided with a common-mode reactor for taking measures against noise. The common-mode reactor for such noise control measures causes magnetic saturation if common-mode current exceeding the saturation level flows through the common-mode reactor. As a result, an inductance value decreases greatly, and a noise reduction effect is reduced. In view of this, there is a demand for technology for detecting a saturation state of the common-mode reactor and determining whether or not the noise reduction effect is properly functioning. Patent Literature 1 below discloses technology for detecting a saturation state of a core of a current sensor.

CITATION LIST

Patent Literature

Patent Literature 1: Japanese Patent Application Laid-open No. 2006-352949

SUMMARY

Technical Problem

Conventional technology including Patent Literature 1 above suggests no device for measuring a saturation state of a common-mode reactor and determining that a noise reduction effect is reduced. In addition, the technology in Patent Literature 1 described above utilizes an output voltage value output from the same terminal of the current sensor for current measurement at a time of normal operation and measurement of the saturation state. For this reason, these two measurements cannot be performed simultaneously. In view of this, technology capable of properly detecting the saturation state of the common-mode reactor is required.

The present invention has been made in view of the above, and an object thereof is to obtain a power conversion device capable of properly detecting a saturation state of a common-mode reactor.

Solution to Problem

In order to solve the above-described problems and achieve the object, a power conversion device according to the present invention includes a power converter that converts direct current power into alternating current power for a load, and a common-mode reactor that reduces common-mode current that flows between the power converter and the load. The common-mode reactor has first and second auxiliary windings added thereto. In addition, the power conversion device includes a signal generator that superimposes an alternating current on the first auxiliary winding, and a detection circuit that detects a saturation state of the common-mode reactor on the basis of a superimposed current superimposed on the first auxiliary winding and a winding voltage generated in the second auxiliary winding by the superimposed current.

Advantageous Effects of Invention

The power conversion device according to the present invention has an effect of properly detecting the saturation state of the common-mode reactor.

BRIEF DESCRIPTION OF DRAWINGS

FIG. 9 is a flowchart used for description of a magnetic saturation detection method according to the third embodiment.

DESCRIPTION OF EMBODIMENTS

A power conversion device and a magnetic saturation detection method for a common-mode reactor (hereinafter, simply referred to as a "magnetic saturation detection method") according to embodiments of the present invention will be hereinafter described in detail with reference to the accompanying drawings. Note that the present invention is not limited to the following embodiments.

First Embodiment

Figure 1:
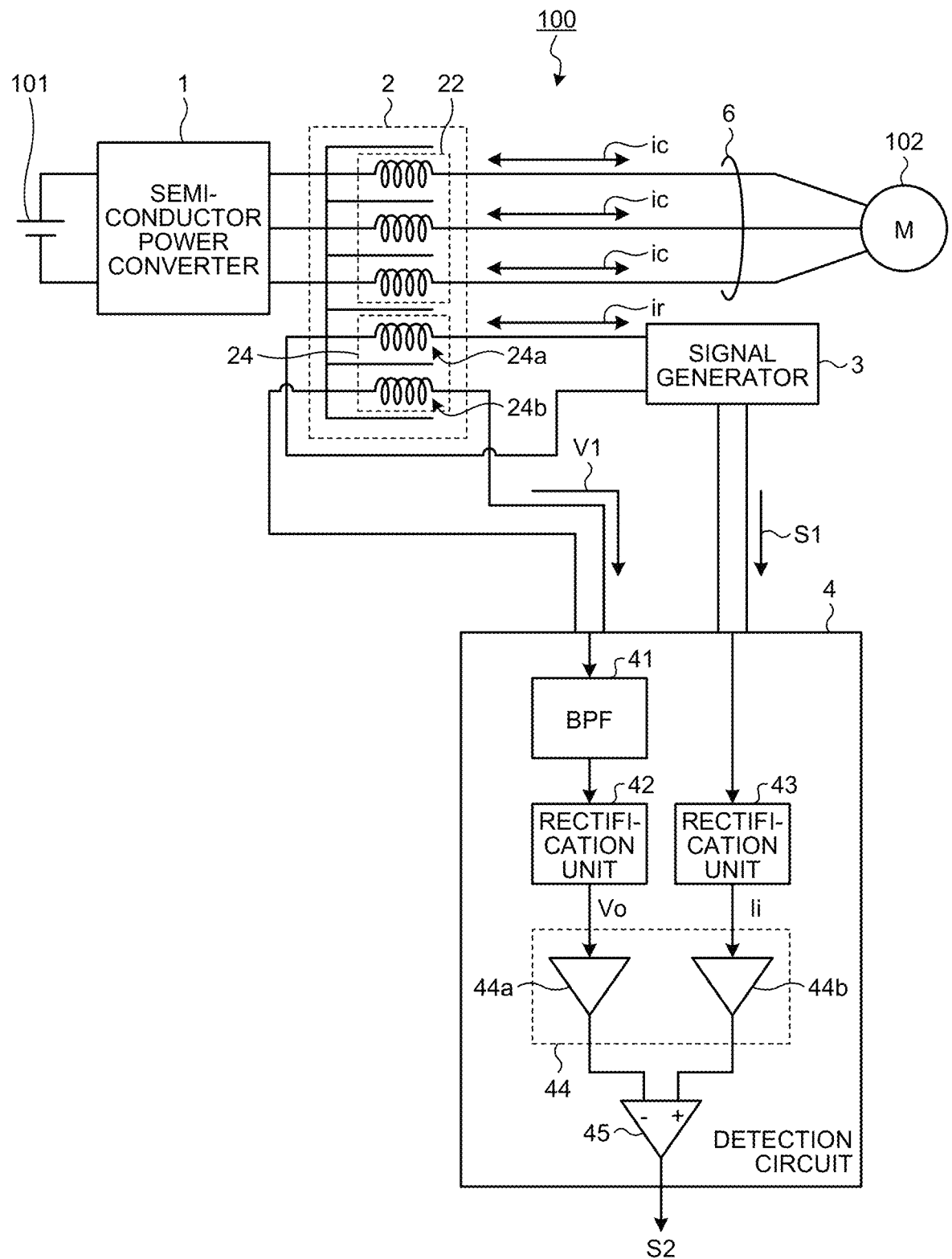
FIG. 1 is a diagram illustrating a configuration of a power conversion device according to a first embodiment.

FIG. 1 is a diagram illustrating a configuration of a power conversion device according to a first embodiment. A power conversion device 100 illustrated in FIG. 1 includes a semiconductor power converter 1, a common-mode reactor 2, a signal generator 3, and a detection circuit 4. The semiconductor power converter 1 is a power converter including semiconductor switching elements. The semiconductor power converter 1 converts direct current power supplied from direct current power supply 101 into alternating current power to a motor 102 as a load, and supplies the alternating current power to the motor 102. An example of the motor 102 is a three-phase motor as illustrated in the drawing. Instead of the three-phase motor, a single-phase motor or a polyphase motor may be used.

The semiconductor power converter 1 and the motor 102 are electrically connected to each other by three electric wirings 6. The common-mode reactor 2 includes choke coils 22 and an auxiliary winding 24 that have a common magnetic core. The choke coils 22 include three windings, and each of the windings is inserted into the corresponding one of the electric wirings 6 between the semiconductor power converter 1 and the motor 102. Note that, although FIG. 1 illustrates, by way of example, the common-mode reactor 2 having the choke coils 22 inserted into the electric wirings 6, the present invention is not limited thereto.

The auxiliary winding 24 of the common-mode reactor 2 includes a first auxiliary winding 24a and a second auxiliary winding 24b. The first auxiliary winding 24a and the second auxiliary winding 24b are magnetically coupled to each other. In addition, the first auxiliary winding 24a and the second auxiliary winding 24b are also magnetically coupled to each of the three choke coils 22. The first auxiliary winding 24a is connected to the signal generator 3 and the second auxiliary winding 24b is connected to the detection circuit 4. The signal generator 3 is also connected to the detection circuit 4.

The detection circuit 4 includes a Band Pass Filter (BPF) 41, rectification units 42 and 43, a gain adjustment unit 44, and a comparator 45. In addition, the gain adjustment unit 44 includes amplifiers 44a and 44b.

Figure 2:
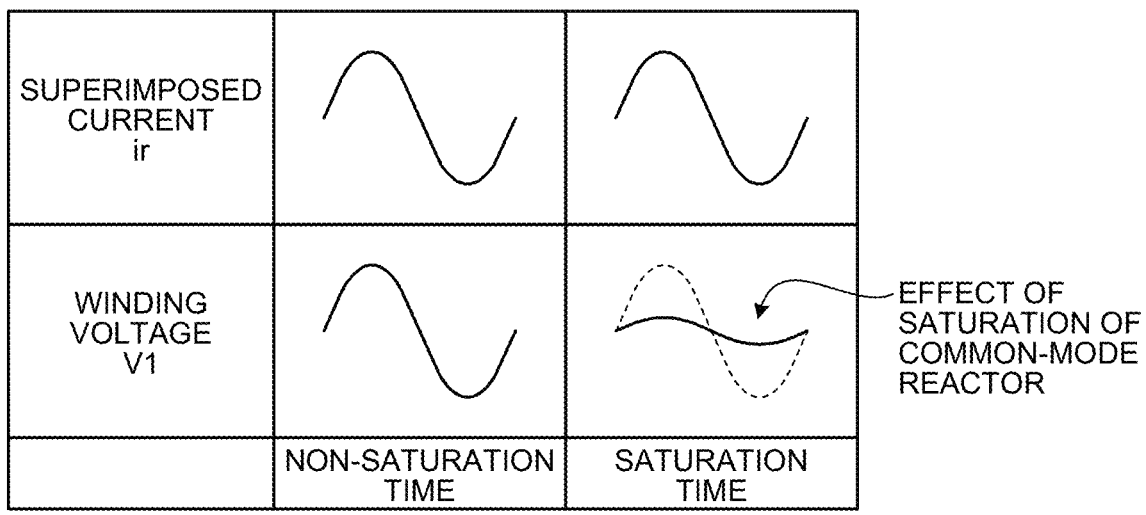
FIG. 2 is a diagram used for description of an operating principle of the power conversion device according to the first embodiment.

Next, operation of the power conversion device 100 according to the first embodiment will be described with reference to FIGS. 1 and 2. FIG. 2 is a diagram used for description of an operating principle of the power conversion device according to the first embodiment.

While power is supplied from the semiconductor power converter 1 to the motor 102, a common-mode current ic flows in the same direction through the common-mode reactor 2. The common-mode current ic is an alternating current. The common-mode current ic is a main cause of radiation noise and conduction noise. While the common-mode current ic flows through the electric wirings 6, the signal generator 3 superimposes an alternating current on the first auxiliary winding 24a. This alternating current is referred to as "superimposed current" and is represented by "ir".

When the superimposed current ir flows through the first auxiliary winding 24a, an induced voltage is generated in the second auxiliary winding 24b. This induced voltage is referred to as "winding voltage" and is represented by "V1". The winding voltage V1 is input to the BPF 41 of the detection circuit 4. In addition, a superimposed current signal S1 output from the signal generator 3 is input to the detection circuit 4. The superimposed current signal S1 is a signal having a waveform identical to a waveform of the superimposed current ir. Note that the superimposed current signal S1 does not necessarily have the identical waveform. Rather it is only required that the superimposed current signal S1 have a main frequency component identical to the superposed current ir, and the amplitude of the superimposed current signal S1 increase as the amplitude of the superimposed current ir increases, and decrease as the amplitude of the superimposed current ir decreases.

As described above, the common-mode current ic flows through the common-mode reactor 2. For this reason, a component resulting from the common-mode current ic also appears in the winding voltage V1. That is, a first component resulting from the superimposed current ir and a second component resulting from the common-mode current ic appear in the winding voltage V1. In order to distinguish between the first component and the second component, the first component has a specific frequency component. The BPF 41 is a filter that allows only this specific frequency component to pass therethrough. That is, the BPF 41 extracts a frequency component of the superimposed current ir from the winding voltage V1 and inputs the extracted frequency component to the rectification unit 42.

A waveform of the winding voltage V1 of when the common-mode reactor 2 is not saturated (hereinafter, referred to as "non-saturation time") is illustrated on the left side of FIG. 2. In addition, the waveform of the winding voltage V1 of when the common-mode reactor 2 is saturated (hereinafter, referred to as "saturation time") is illustrated on the right side of FIG. 2. These waveforms are waveforms after passing through the BPF 41. In the non-saturation time, mutual inductance between the first auxiliary winding 24a and the second auxiliary winding 24b (hereinafter, referred to as "between the auxiliary windings") takes on a certain value. In the saturation time, the mutual inductance between the auxiliary windings is smaller than a certain value. As a result, in the non-saturation time, the waveform of the winding voltage V1 becomes a waveform corresponding to an amplitude value of the superimposed current ir. In the saturation time, the waveform of the winding voltage V1 does not become a waveform corresponding to the amplitude value of the superimposed current ir, because the mutual inductance becomes small. Specifically, the amplitude value of the winding voltage V1 in the saturation time is smaller than the amplitude value of the winding voltage V1 in the non-saturation time.

As can be understood from the above description, viewing the winding voltage V1 output from the BPF 41 when carrying the superimposed current ir can determine whether or not the common-mode reactor 2 is saturated. In addition, the passage of the output of the winding voltage V1 through the BPF 41 can determine a saturation state although the winding voltage is subjected to disturbance due to the common-mode current ic. As a result, presence or absence of a noise reduction effect can be determined. Note that the number of specific frequency components is not necessarily one, and a plurality of specific frequency components may be set. By setting a plurality of specific frequency components to make the determination, it is also possible to enhance a resistance to disturbance.

Note that, if the superimposed current it is set to zero when the common-mode reactor 2 is not saturated, a noise current component flowing through the common-mode reactor 2 appears in the winding voltage V1. As a result, noise current can be measured.

The detection circuit 4 in FIG. 1 includes the rectification unit 42 that is a first rectification unit, the rectification unit 43 that is a second rectification unit, the gain adjustment unit 44, and the comparator 45. The rectification units 42, 43, the gain adjustment unit 44, and the comparator 45 define components for quantitatively determining a saturation state of the common-mode reactor 2, in other words, the noise reduction effect provided by the common-mode reactor 2. The rectification unit 42 rectifies the winding voltage V1, and outputs a first rectification value to the amplifier 44a. The first rectification value, which results from the rectification, is a winding voltage amplitude Vo. The rectification unit 43 rectifies the superimposed current signal S1, and outputs a second rectification value to the amplifier 44b. The second rectification value, which results from the rectification, is a superimposed current signal amplitude Ii. The amplifier 44a adjusts a level of the winding voltage amplitude Vo. The amplifier 44b adjusts a level of the superimposed current signal amplitude Ii.

An output of the amplifier 44a is input to a negative terminal of the comparator 45, and an output of the amplifier 44b is input to a positive terminal of the comparator 45. The comparator 45 outputs a determination result S2 that is a comparison signal obtained by comparing the output of the amplifier 44a with the output of the amplifier 44b. If the output of the amplifier 44a and the output of the amplifier 44b are equivalent to each other, the determination result S2 is a signal indicating "non-saturation". If the output of the amplifier 44a is smaller than the output of the amplifier 44b, the determination result S2 is a signal indicating "saturation".

The individual outputs of the amplifiers 44a and 44b are required to be adjusted to have such signal levels that, in the non-saturation time, the outputs of the respective amplifiers 44a and 44b are equivalent to each other or the output of the amplifier 44a is greater than the output of the amplifier 44b, and that, in the saturation time, the output of the amplifier 44a is smaller than the output of the amplifier 44b. A level of the superimposed current signal S1 is relatively easily adjustable, whereas the winding voltage V1 is more difficult to adjust than the superimposed current signal S1. For this reason, it is only required that the gain adjustment unit 44 adjust at least an output level of the amplifier 44a. That is, the output level of the amplifier 44b may be fixed, and only the output level of the amplifier 44a may be adjusted.

In addition, level adjustments in the amplifiers 44a and 44b is preferably conducted when a product equipped with the common-mode reactor 2 is placed under a practical use environment. However, it is not always necessary to conduct the level adjustment immediately after installing the product or before starting to use the product, and the level adjustment may be conducted at a time when it is clear that the common-mode reactor 2 is in a non-saturation state.

Since the technique disclosed in Patent Literature 1 above utilizes an output voltage value output from the same terminal of the current sensor for the current measurement at a time of normal operation and the measurement of the saturation state, these two measurements cannot be performed simultaneously. During current detection operation at the time of the normal operation, therefore, the saturation state cannot be measured, and a period during which the determination can be made is limited. In contrast, the technique in the first embodiment can continuously carry superimposed current even during the normal operation. According to the technique in the first embodiment, therefore, it is possible to diagnose the saturation state of the common-mode reactor 2 while performing the normal operation.

Figure 3:
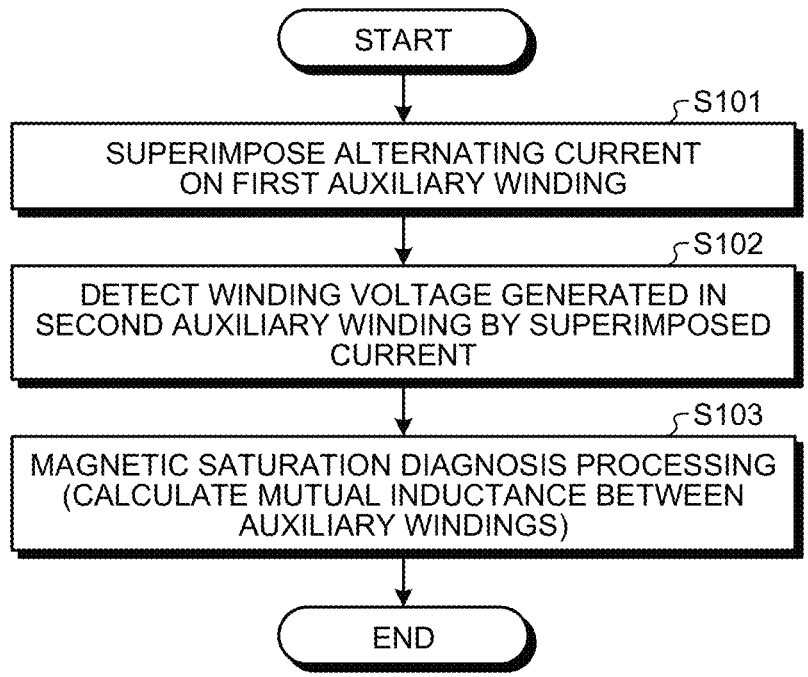
FIG. 3 is a flowchart used for description of a magnetic saturation detection method according to the first embodiment.

FIG. 3 is a flowchart used for description of a magnetic saturation detection method according to the first embodiment. In step S101, alternating current is superimposed on the first auxiliary winding 24a by the signal generator 3. In step S102, the winding voltage V1 generated in the second auxiliary winding 24b by the superimposed current it is detected. In step S103, mutual inductance M between the auxiliary windings is calculated as data used for magnetic saturation diagnosis processing. Specifically, the mutual inductance M between the auxiliary windings can be calculated using the following Formula (1) that uses the winding voltage amplitude Vo and the superimposed current signal amplitude Ii.

$$M = Vo/(k \cdot Ii) \tag{1}$$

Note that, in Formula (1) above, k is a coefficient depending on a circuit, that is, a coupling coefficient, and is a fixed value.

As described above, in the saturation time of the common-mode reactor 2, the mutual inductance M between the auxiliary windings is smaller than a certain value. Accordingly, calculating the mutual inductance M makes it possible to quantitatively determine the saturation state of and the noise reduction effect by the common-mode reactor 2.

Figure 4:
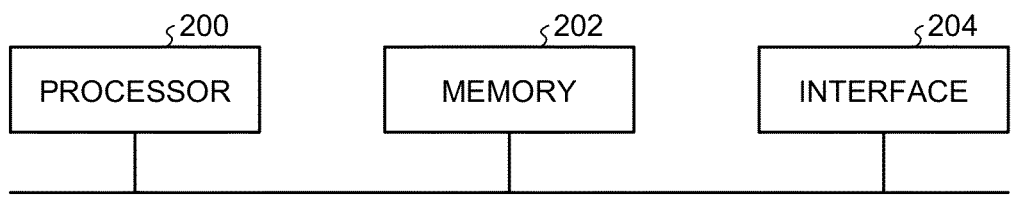
FIG. 4 is a block diagram illustrating an example configuration of a calculation device that implements a function of diagnosis processing in the first embodiment.
Figure 5:
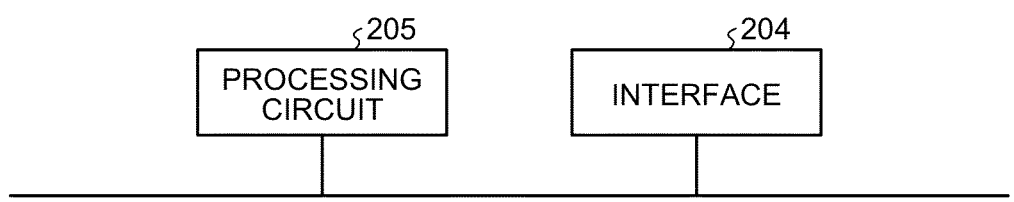
FIG. 5 is a block diagram illustrating another example configuration of the calculation device that implements the function of the diagnosis processing in the first embodiment.

The data used for the magnetic saturation diagnosis processing can be calculated using a calculation device having a configuration illustrated in FIG. 4 or 5. FIG. 4 is a block diagram illustrating an example configuration of the calculation device that implements a function of the diagnosis processing in the first embodiment. FIG. 5 is a block diagram illustrating another example configuration of the calculation device that implements the function of the diagnosis processing in the first embodiment.

As illustrated in FIG. 4, a calculation device 50 that implements the function of the diagnosis processing in the first embodiment can be configured including a processor 200 that performs calculation, a memory 202 that saves a program read by the processor 200, and an interface 204 that inputs and outputs a signal.

The processor 200 may be a calculation means such as a microprocessor, a microcomputer, a central processing unit (CPU), or a digital signal processor (DSP). In addition, the memory 202 can be exemplified by a non-volatile or volatile semiconductor memory such as a random access memory (RAM), a read only memory (ROM), a flash memory, an erasable programmable ROM (EPROM), or an electrically EPROM (EEPROM) (registered trademark).

The memory 202 stores a program for executing the function of the diagnosis processing in the first embodiment. The processor 200 receives and outputs necessary information via the interface 204. The necessary information mentioned here includes the winding voltage V1, the superimposed current ir, the superimposed current signal S1, the winding voltage amplitude Vo, the superimposed current signal amplitude Ii, the determination result S2, or the like. By using the information received via the interface 204 and executing a program stored in the memory 202, the processor 200 can perform required diagnosis processing. A result of the calculation by the processor 200 can be stored in the memory 202.

In addition, the processor 200 and the memory 202 illustrated in FIG. 4 may be replaced with processing circuitry 205 as illustrated in FIG. 5. The processing circuitry 205 corresponds to a single circuit, a complex circuit, an application specific integrated circuit (ASIC), a field-programmable gate array (FPGA), or a combination thereof. Information can be input to the processing circuitry 205 via the interface 204, and information can be output from the processing circuitry 205 via the interface 204.

As described above, the power conversion device according to the first embodiment detects a saturation state of a common-mode reactor on the basis of the superimposed current superimposed on a first auxiliary winding and the winding voltage generated in a second auxiliary winding by the superimposed current. As a result, the saturation state of the common-mode reactor can be detected during the flow of common-mode current through the common-mode reactor. As a result, it is possible to detect the saturation state of the common-mode reactor while performing the normal operation.

In addition, the power conversion device according to the first embodiment includes the calculation device for quantitatively determining the saturation state of the common-mode reactor. The calculation device calculates the mutual inductance between the auxiliary windings. If this mutual inductance is used as the data used for the magnetic saturation diagnosis processing, the saturation state of and the noise reduction effect by the common-mode reactor can be quantitatively determined.

In addition, the method for detecting the magnetic saturation of the common-mode reactor according to the first embodiment includes a first step of a superimposing alternating current on the first auxiliary winding, a second step of detecting a winding voltage generated in the second auxiliary winding by the superimposed current, and a third step of detecting the magnetic saturation of the common-mode reactor on the basis of the superimposed current and the winding voltage. As a result, the saturation state of the common-mode reactor can be detected during the flow of the common-mode current through the common-mode reactor. This makes it possible to detect the saturation state of the common-mode reactor while performing the normal operation.

Note that the third step described above may include processing of calculating the mutual inductance between the auxiliary windings. If the mutual inductance between the auxiliary windings is used as the data used for the magnetic saturation diagnosis processing, the saturation state of and the noise reduction effect by the common-mode reactor can be quantitatively determined.

Second Embodiment

Figure 6:
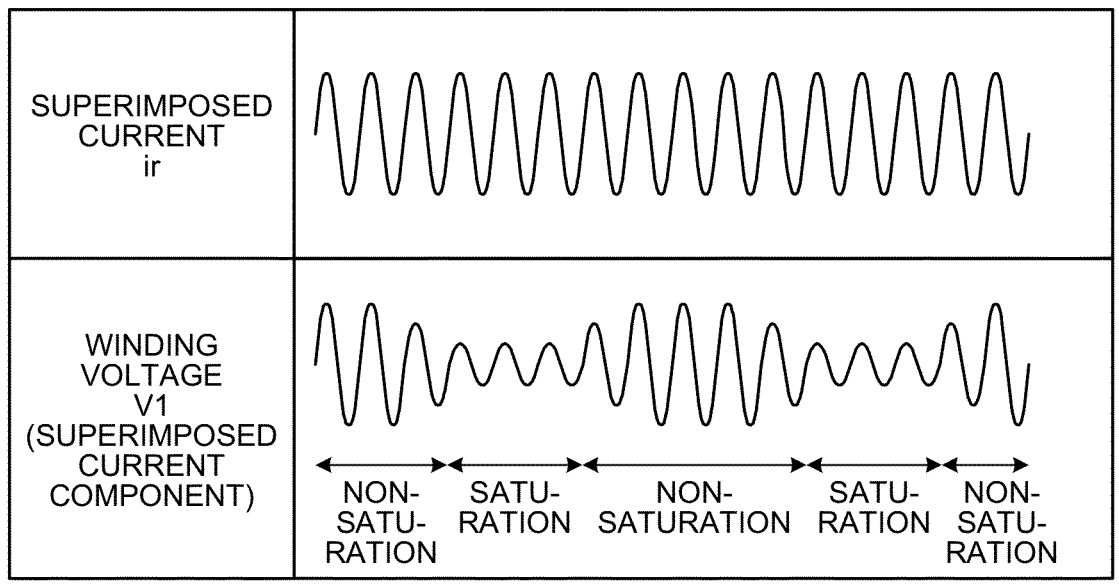
FIG. 6 is a diagram used for description of an operating principle of a power conversion device according to a second embodiment.

Next, a power conversion device and magnetic saturation detection method according to a second embodiment will be described. FIG. 6 is a diagram used for description of an operating principle of the power conversion device according to the second embodiment. Note that the power conversion device and the method for detecting the magnetic saturation of a common-mode reactor according to the second embodiment can be implemented using the power conversion device 100 illustrated in FIG. 1.

In the second embodiment, frequency of the superimposed current ir is set higher than frequency of the common-mode current ic, and then the superimposed current ir is carried through the first auxiliary winding 24a. Note that the frequency of the common-mode current ic mentioned here means frequency at which there is a relatively large effect of radiation noise by the common-mode current ic, and specifically the frequency of the common-mode current ic is a few dozen kHz to a few hundred kHz. In this case, the frequency of the superimposed current ir can be set to about a few MHz. Note that a difference in frequency between the frequency of the superimposed current ir and the frequency of the common-mode current ic is determined by a relation with a bandwidth of the BPF 41 of the detection circuit 4. Accordingly, the better performance of the BPF 41 is, the smaller the difference in frequency can be.

If the superimposed current ir is continuously carried to the first auxiliary winding 24a, it is possible to obtain a trend curve in which a change in a saturation state is reflected in auxiliary winding voltage. An example of the trend curve is illustrated in the lower part of FIG. 6. Adjusting the gain of the gain adjustment unit 44 illustrated in FIG. 1 can appropriately adjust the amplitude of the winding voltage V1. In FIG. 6, intervals in which the amplitude of the winding voltage V1 decreases are saturation periods, and other intervals are non-saturation periods. In a case where a majority of the trend curve is in the saturation state, for example, it can be determined that an excessive noise current component flows through the common-mode reactor 2, or that excessive common-mode current is flows because of occurrence of a ground fault.

Figure 7:
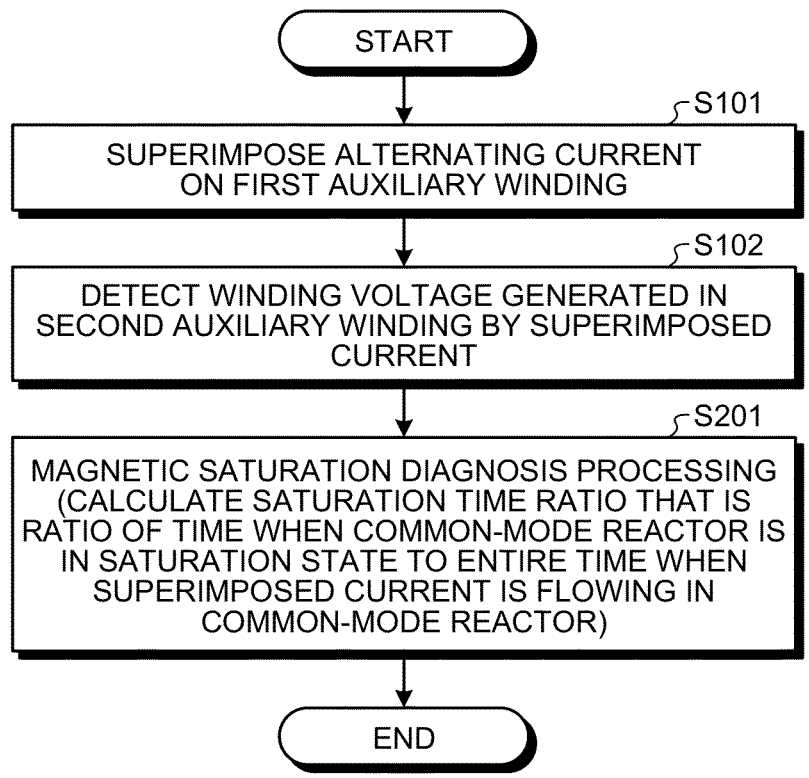
FIG. 7 is a flowchart used for description of a magnetic saturation detection method according to the second embodiment.

FIG. 7 is a flowchart used for description of the magnetic saturation detection method according to the second embodiment. In step S101, an alternating current is superimposed on the first auxiliary winding 24a by the signal generator 3. In step S102, the winding voltage V1 generated in the second auxiliary winding 24b by the superimposed current ir is detected. In step S201, a saturation time ratio is calculated as the data used for magnetic saturation diagnosis processing. The saturation time ratio is a ratio of time when the common-mode reactor 2 is in the saturation state to the entire time when the superimposed current ir flows through the common-mode reactor 2. That is, the saturation time ratio represents a ratio of saturation time to time of application of the superimposed current ir. The saturation time ratio can be calculated by the processor 200 illustrated in FIG. 4 or the processing circuitry 205 illustrated in FIG. 5. Calculating and using the saturation time ratio can quantitatively determine the saturation state of and a noise reduction effect by the common-mode reactor 2.

As described above, the power conversion device according to the second embodiment includes a calculation device for quantitatively determining the saturation state of the common-mode reactor. The calculation device calculates the saturation time ratio, i.e., the ratio of the time when the common-mode reactor is in the saturation state to the entire time when the superimposed current flows through the common-mode reactor. If this saturation time ratio is used as the data used for the magnetic saturation diagnosis processing, the saturation state of and the noise reduction effect by the common-mode reactor can be quantitatively determined.

In addition, the method for detecting the magnetic saturation of the common-mode reactor according to the second embodiment includes a first step of superimposing the alternating current on the first auxiliary winding, a second step of detecting the winding voltage generated in the second auxiliary winding by the superimposed current, and a third step of calculating the saturation time ratio that is a ratio of time when the common-mode reactor is in the saturation state to the entire time when the superimposed current flows through the common-mode reactor. As a result, the saturation state of the common-mode reactor can be detected during the flow of the common-mode current through the common-mode reactor. In addition, using the saturation time ratio can quantitatively determine the saturation state of and the noise reduction effect by the common-mode reactor.

Third Embodiment

Figure 8:
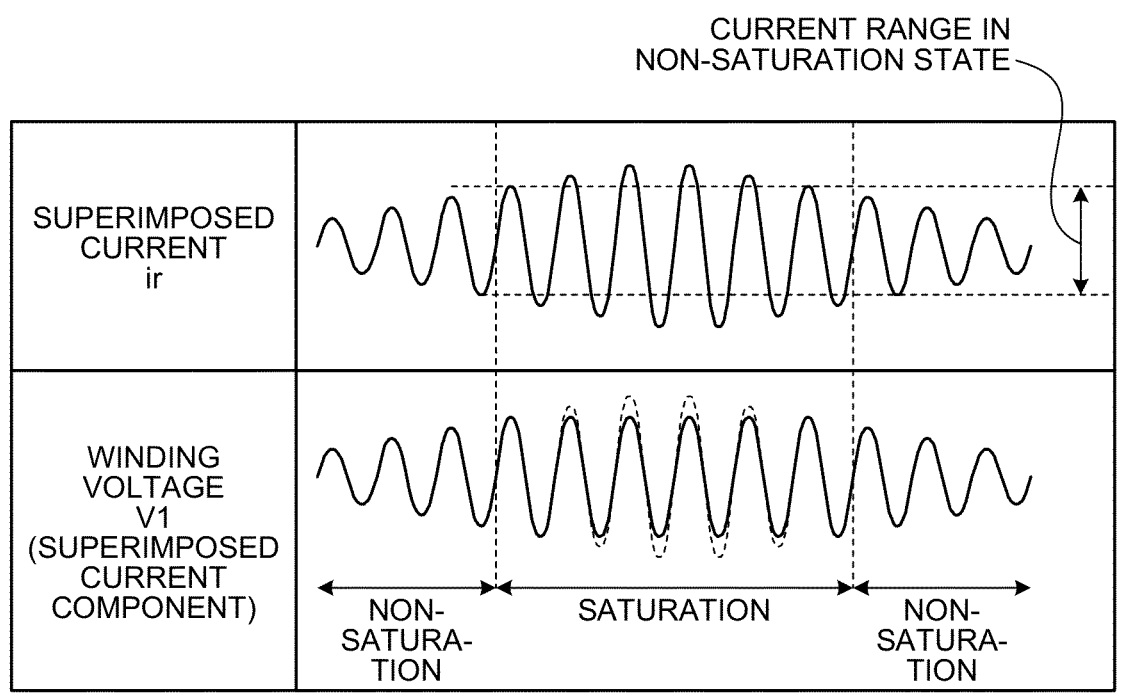
FIG. 8 is a diagram used for description of an operating principle of a power conversion device according to a third embodiment.

Next, a power conversion device and magnetic saturation detection method according to a third embodiment will be described. FIG. 8 is a diagram used for description of an operating principle of the power conversion device according to the third embodiment. Note that the power conversion device and the method for detecting the magnetic saturation of the common-mode reactor according to the third embodiment can be implemented using the power conversion device 100 illustrated in FIG. 1.

In the third embodiment, the winding voltage V1 is measured changing an amplitude value of the superimposed current ir. If the amplitude value of the superimposed current ir is changed, an output of the winding voltage V1 corresponding to a change in the amplitude value of the superimposed current ir appears in the non-saturation period. In contrast, the output of the winding voltage V1 corresponding to a change in the amplitude value of the superimposed current ir does not appear in the saturation periods. The third embodiment utilizes this phenomenon. Specifically, in the third embodiment, a current range of the common-mode reactor 2 in a non-saturation state is calculated on the basis of the amplitude value of the superimposed current ir when the common-mode reactor 2 changes from a non-saturation state to a saturation state or from a saturation state to a non-saturation state as the amplitude value of superimposed current is changed. Using the current range in the non-saturation state makes it possible to grasp how much magnetic flux is generated in the common-mode reactor 2 relative to magnetic flux at a saturation level at which the common-mode reactor 2 is saturated. In addition, it is possible to grasp a margin of the current amplitude at which saturation starts.

FIG. 9 is a flowchart used for description of the magnetic saturation detection method according to the third embodiment. In step S101, the alternating current is superimposed on the first auxiliary winding 24a by the signal generator 3. In step S102, the winding voltage V1 generated in the second auxiliary winding 24b by the superimposed current ir is detected. In step S301, the amplitude value of the superimposed current ir of when the common-mode reactor 2 changes from the non-saturation state to the saturation state or from the saturation state to the non-saturation state as the amplitude value of the superimposed current ir is changed is detected. In step S302, the current range of the common-mode reactor 2 in the non-saturation state is calculated on the basis of the amplitude value of the superimposed current ir detected in S301. The processing in step S301 and step S302 corresponds to the magnetic saturation diagnosis processing (step S103) illustrated in FIG. 3. The current range in the non-saturation state can be calculated by the processor 200 illustrated in FIG. 4 or the processing circuitry 205 illustrated in FIG. 5. Calculating and using the current range in the non-saturation state can quantitatively determine the saturation state of and a noise reduction effect by the common-mode reactor 2.

As described above, the power conversion device according to the third embodiment includes a calculation device for quantitatively determining the saturation state of the common-mode reactor. The calculation device calculates the current range of the common-mode reactor in the non-saturation state on the basis of the amplitude value of the superimposed current of when the common-mode reactor changes from the non-saturation state to the saturation state or from the saturation state to the non-saturation state as the amplitude value of the superimposed current is changed. Using the current range in the non-saturation state as the data used for the magnetic saturation diagnosis processing can quantitatively determine the saturation state of and the noise reduction effect by the common-mode reactor.

In addition, the magnetic saturation detection method for the common-mode reactor according to the third embodiment includes a first step of superimposing the alternating current on the first auxiliary winding, a second step of detecting the winding voltage generated in the second auxiliary winding by the superimposed current, and a third step of calculating the current range of the common-mode reactor in the non-saturation state on the basis of the amplitude value of the superimposed current of when the common-mode reactor changes from the non-saturation state to the saturation state or from the saturation state to the non-saturation state as the amplitude value of the superimposed current is changed. As a result, the saturation state of the common-mode reactor can be detected during the flow of the common-mode current through the common-mode reactor. In addition, using the current range in the non-saturation state can quantitatively determine the saturation state of and the noise reduction effect by the common-mode reactor.

Note that the configurations described in the above embodiments illustrate an example of content of the present invention, and can be combined with another known technology, and a part of the configurations can be omitted or changed without departing from the gist of the present invention.

REFERENCE SIGNS LIST 1 semiconductor power converter; 2 common-mode reactor; 3 signal generator; 4 detection circuit; 6 electric wirings; 22 choke coils; 24 auxiliary winding; 24a first auxiliary winding; 24b second auxiliary winding; 41 band pass filter (BPF); 42, 43 rectification unit; 44 gain adjustment unit; 44a, 44b amplifier; 45 comparator; 50 calculation device; 100 power conversion device; 101 direct current power supply; 102 motor; 200 processor; 202 memory; 204 interface; 205 processing circuit.

The invention claimed is:

1. A power conversion device comprising:
a power converter to convert direct current power into alternating current power for a load;
a common-mode reactor having first and second auxiliary windings added thereto, the common-mode reactor reducing a common-mode current that flows between the power converter and the load;
a signal generator to superimpose an alternating current on the first auxiliary winding; and
a detection circuit to detect a saturation state of the common-mode reactor on a basis of a superimposed current superimposed on the first auxiliary winding and a winding voltage generated in the second auxiliary winding by the superimposed current.

2. The power conversion device according to claim 1, wherein a frequency of the superimposed current is higher than a frequency of the common-mode current.

3. The power conversion device according to claim 1, wherein
the detection circuit detects a saturation state of the common-mode reactor during flow of the common-mode current through the common-mode reactor.

4. The power conversion device according to claim 1, wherein
the detection circuit includes
a first rectifier to rectify the winding voltage,
a second rectifier to rectify a superimposed current signal output from the signal generator,
a level adjuster to adjust at least an output level of a first rectification value among the first rectification value output from the first rectification unit and a second rectification value output from the second rectification unit, and
a comparator to compare the first rectification value output from the level adjustment unit with the second rectification value.

5. The power conversion device according to claim 1, comprising
a calculator for quantitatively determining a saturation state of the common-mode reactor, wherein the calculator calculates a mutual inductance between the first auxiliary winding and the second auxiliary winding.

6. The power conversion device according to claim 1, comprising
a calculator for quantitatively determining a saturation state of the common-mode reactor, wherein
the calculator calculates a saturation time ratio that is a ratio of time when the common-mode reactor is in a saturation state to an entire time when the superimposed current flows through the common-mode reactor.

7. The power conversion device according to claim 1, comprising
a calculator for quantitatively determining a saturation state of the common-mode reactor, wherein
the calculator calculates a current range of the common-mode reactor in a non-saturation state on the basis of an amplitude value of the superimposed current of when the common-mode reactor changes from a non-saturation state to a saturation state or from a saturation state to a non-saturation state as the amplitude value of the superimposed current is changed.

8. A magnetic saturation detection method for detecting magnetic saturation of a common-mode reactor, the common-mode reactor being disposed between a power converter and a load and having first and second auxiliary windings added thereto, the method being applied to a device, the device including the common-mode reactor and a signal generator to generate a current to be superimposed on the first auxiliary winding, the method comprising:
superimposing an alternating current on the first auxiliary winding;
detecting a winding voltage generated in the second auxiliary winding by a superimposed current superimposed on the first auxiliary winding; and
detecting magnetic saturation of the common-mode reactor on a basis of the superimposed current and the winding voltage.

9. The magnetic saturation detection method for a common-mode reactor according to claim 8, wherein detecting the magnetic saturation of the common-mode reactor includes processing of calculating a mutual inductance between the first auxiliary winding and the second auxiliary winding.

10. The magnetic saturation detection method for a common-mode reactor according to claim 8, wherein detecting the magnetic saturation of the common-mode reactor includes processing of calculating a saturation time ratio that is a ratio of time when the common-mode reactor is in a saturation state to an entire time when the superimposed current flows through the common-mode reactor.

11. The magnetic saturation detection method for a common-mode reactor according to claim 8, wherein detecting the magnetic saturation of the common-mode reactor includes processing of calculating a current range of the common-mode reactor in a non-saturation state on the basis of an amplitude value of the superimposed current of when the common-mode reactor changes from a non-saturation state to a saturation state or from a saturation state to a non-saturation state as the amplitude value of the superimposed current is changed.

* * * * *